United States Patent
Yin et al.

(10) Patent No.: US 8,366,829 B2
(45) Date of Patent: Feb. 5, 2013

(54) MULTI-STATION DECOUPLED REACTIVE ION ETCH CHAMBER

(75) Inventors: Gerald Yin, Shanghai (CN); Tuqiang Ni, Shanghai (CN); Jinyuan Chen, Shanghai (CN); Xueyu Qian, Shanghai (CN)

(73) Assignee: Advanced Micro-Fabrication Equipment, Inc. Asia, Georgetown, Grand Cayman (KY)

( * ) Notice: Subject to any disclaimer, the term of this patent is extended or adjusted under 35 U.S.C. 154(b) by 920 days.

(21) Appl. No.: 11/772,726

(22) Filed: Jul. 2, 2007

(65) Prior Publication Data

US 2008/0011424 A1    Jan. 17, 2008

Related U.S. Application Data

(63) Continuation-in-part of application No. 11/441,290, filed on May 24, 2006.

(30) Foreign Application Priority Data

Aug. 5, 2005  (CN) .......................... 2005 1 0028567
Jun. 20, 2007  (CN) .......................... 2007 1 0042285

(51) Int. Cl.
    *C23C 16/00* (2006.01)
    *C23F 1/00* (2006.01)
    *H01L 21/306* (2006.01)
(52) U.S. Cl. .................... 118/719; 118/723 E; 118/733; 156/345.31; 156/345.47
(58) Field of Classification Search .................. 118/719; 156/345.31, 345.32; 204/298.23, 298.25, 204/298.26, 298.35
See application file for complete search history.

(56) References Cited

U.S. PATENT DOCUMENTS

| | | | |
|---|---|---|---|
| 5,169,478 A * | 12/1992 | Miyamoto et al. | 156/345.37 |
| 5,811,022 A | 9/1998 | Savas et al. | |
| 5,855,681 A | 1/1999 | Maydan et al. | |
| 6,019,848 A * | 2/2000 | Frankel et al. | 118/715 |
| 6,110,287 A * | 8/2000 | Arai et al. | 156/345.34 |
| 6,111,225 A * | 8/2000 | Ohkase et al. | 219/390 |
| 6,178,919 B1 * | 1/2001 | Li et al. | 118/723 E |
| 6,227,140 B1 * | 5/2001 | Kennedy et al. | 118/723 R |
| 6,552,297 B2 * | 4/2003 | Blonigan et al. | 219/121.43 |
| 6,962,644 B2 | 11/2005 | Paterson et al. | |
| 7,009,281 B2 * | 3/2006 | Bailey et al. | 257/642 |
| 2005/0133163 A1 | 6/2005 | Shannon et al. | |
| 2005/0247265 A1 * | 11/2005 | Devine et al. | 118/719 |
| 2007/0030091 A1 | 2/2007 | Xia | |

FOREIGN PATENT DOCUMENTS

| | | |
|---|---|---|
| CN | 1909184 A | 2/2007 |
| CN | 1909185 A | 2/2007 |
| CN | 1948550 A | 4/2007 |

* cited by examiner

*Primary Examiner* — Karla Moore
(74) *Attorney, Agent, or Firm* — Nixon Peabody LLP; Joseph Bach, Esq.

(57) ABSTRACT

A tandem processing-zones chamber having plasma isolation and frequency isolation is provided. At least two RF frequencies are fed from the cathode for each processing zones, where one frequency is about ten times higher than the other, so as to provide decoupled reactive ion etch capability. The chamber body is ground all around and in-between the two processing zones. The use of frequency isolation enables feed of multiple RF frequencies from the cathode, without having crosstalk and beat. A plasma confinement ring is also used to prevent plasma crosstalk. A grounded common evacuation path is connected to a single vacuum pump.

17 Claims, 7 Drawing Sheets

MULTI-STATION DECOUPLED REACTIVE ION ETCH CHAMBER

RELATED APPLICATIONS

This application is a continuation-in-part of U.S. application, Ser. No. 11/441,290, filed May 24, 2006, which in turn claims priority from Chinese Patent Application, Serial Number 200510028567.0, filed on Aug. 5, 2005, the disclosures of both of which are incorporated herein by reference in their entirety. This application also claims priority from Chinese Patent Application, Serial Number 200710042285.5, filed on Jun. 20, 2007.

BACKGROUND

1. Field of the Invention

The subject invention relates to plasma processing chambers and, more specifically, to plasma processing chambers having at least twin or tandem processing regions enabling processing of at least two substrates simultaneously.

2. Related Art

In the fabrication of semiconductor wafers, two types of semiconductor processing systems are commonly employed. The first type of systems commonly used is generally referred to as batch processing systems. The chief reason behind development of batch processing systems is that several wafers are processed simultaneously, thereby providing high throughput. However, with the tightening of performance specifications, the industry has moved to the second type of processing chambers, i.e., single-wafer processing chambers. The chief reason for development of single wafer processing systems is that it is easier to control the process characteristics and uniformity across the wafer.

On the other hand, in some niche applications, attempts have been made to produce a processing chamber capable of processing two wafers at a time. The idea behind this approach is to enable single-wafer processing characteristics, while producing two wafers at a time. One configuration for twin/tandem wafer processing is disclosed in U.S. Pat. No. 5,811,022, which discloses an inductively coupled plasma chamber used for plasma photoresist removal, also known as photoresist ashing. Photoresist ashing is a process of oxidation reaction in which oxygen is used to remove organic photoresists. The photoresist is oxidized into gases such as carbon monoxide, carbon dioxide, and water vapor, and then removed by vacuum pump. Consequently, such application need not have high accuracy of process uniformity over the wafer as more critical applications, such as semiconductor wafer etching.

Since the process requirements of photoresist ashing are not stringent, the chamber proposed in the '022 patent includes two separate plasma generation chambers, both of which being open at the bottom to a wafer processing chamber that houses two wafers. A charged particle filter is provided between the plasma chambers and the processing chamber, so as to prevent charged particles from reaching the processing chamber, but allowing neutral activated species to reach the processing chamber to remove the photoresist from the wafers. Since the processing chamber is constructed so that there is no separation between the two wafers and no plasma can be ignited over the wafers, and further since a filter is provided to remove charged particles from the wafer processing chamber, the chamber of the '022 patent cannot be used for modern critical application, such as semiconductor wafer etching, but only for simple ashing.

Another tandem processing chamber is disclosed in, e.g., U.S. Pat. No. 5,855,681. The processing chamber disclosed in the '681 patent includes two processing regions for simultaneously processing two wafers, and "include[s] separate gas distribution assemblies and RF power sources to provide uniform plasma density over a wafer surface in each processing region." Notably, the authors of the '681 patent explain that the unsatisfactory result provided by the Mattson system (the subject of the '022 patent described above) "is a direct result of having multiple wafers being partially processed at multiple stations within a single chamber." To improve upon this design, the authors of the '681 teach that the chamber should have "isolated processing regions" so as to have "isolated processes [ ] performed concurrently in at least two regions so that at least two wafers can be processed simultaneously."

While the solution of isolating the processing regions enables tandem processing of two wafers simultaneously, it introduces difficulties in what is commonly referred to as chamber matching or station matching. That is, it becomes difficult to control the two processing regions of the chamber to provide identical plasma processing conditions. For example, if one processing region develops higher etch rate than the other region, it becomes difficult to control the endpoint of the etch process. That is, if the end point is determined according to the higher etch rate side, then the wafer of the other side would not be fully etched. On the other hand, if the end point is delayed, then the wafer at the higher etch rate region may be over etched and be damaged.

A modified version of this tandem chamber is disclosed in, e.g., U.S. Pat. No. 6,962,644, which teaches "a chamber defining a plurality of isolated processing regions." In the '644 patent a "central pumping plenum" enables the two chambers "to communicate with each other," which leads to a problem known in the art as RF "crosstalk." RF cross talk is deleterious for tandem processing as conditions change in one processing region adversely effect the processing in the second tandem region.

The isolated tandem chambers described above still have the problem in that due to the isolation, it is hard to match the process results between the two processing regions. Additionally, the tandem chamber described in the '644 patent uses two RF power suppliers that are phase and frequency locked to prevent beating of the RF power from the two sources. This complicates the structure and construction of the chamber. Finally, the method for generating plasma in the tandem chambers described above fail to provide the tight performance specifications required for fabricating advanced semiconductor devices. Accordingly, there is a need in the art for a multiple-wafers chamber that enables high level of performance, while matching the performance in each processing region of the chamber.

SUMMARY

The following summary of the invention is provided in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

Various embodiments of the subject invention provide a at least twin or tandem processing-zones chamber having plasma isolation and frequency isolation, so that multiple RF frequencies can be fed from the bottom for each processing zones. The chamber walls are grounded and partition wall in-between the two processing zones is also grounded. The use of frequency isolation enables feed of multiple RF frequencies from the cathode, without having crosstalk and beat. A plasma confinement ring is used to prevent plasma crosstalk. Also provided is a grounded common evacuation path that is connected to a single vacuum pump.

A micro-channels ring structure is provided at the entrance to the evacuation path to help confine the plasma to the processing region, so that the plasma does not reach into the evacuation path and so that there is no crosstalk between the processing regions. The micro-channels also help in pressure distribution, since the single pump creates asymmetric pumping. The ring also prevents RF radiation leakage between the two processing regions. The ring is made so that the top portion is dielectric so there's no plasma sputtering, but the bottom is conductive and grounded to prevent RF leakage.

The plasma confinement of the subject chamber prevents beating, so that there is no need to have the RF power suppliers phase and frequency locked. Also, because of the plasma confinement and RF separation, either processing region may be operated alone, or both regions together.

According to an aspect of the invention, a plasma processing chamber is provided, having at least two processing regions to enable individual or simultaneous processing of at least two wafers, the chamber comprising:

a chamber body defining at least two plasma processing regions, each processing region having a cathode situated at a lower part thereof and an anode situated in a ceiling thereof, said chamber body defining an evacuation path;

at least one vacuum pump coupled to the evacuation path;

at least two RF match circuits, each RF match circuit simultaneously coupling at least a first RF frequency and a second RF frequency to one of the cathodes; and, wherein the first frequency is higher than the second frequency. The plasma processing chamber may further comprise at least two plasma confinement rings, each situated about a corresponding cathode and preventing plasma communication from a processing region to the evacuation path. In the plasma processing chamber each plasma confinement ring may comprise a plasma shield and an RF shield. The plasma shield may comprise a conductive but floating member and the RF shield comprises a grounded conductive member. The plasma processing chamber may further comprise two movable dielectric isolation rings, each provided at one processing region, each isolation ring defining peripheral boundary of each processing region when the isolation ring assumes its lowered position. The chamber body may define a grounded chamber wall for each processing region, and wherein each isolation ring has a thickness designed to shield the grounded chamber wall from RF energy. Each isolation ring may further comprise at least one pressure equalizing passage. The plasma processing chamber may further comprise a partition wall separating each of two processing regions, wherein the partition wall comprises a pressure equalizing channel, said pressuring equalizing channel mating with the pressure equalizing passage when the isolation ring assumes its lower position. The plasma processing chamber may further comprise a plurality of RF conductors, each coupling energy from one RF match circuit to a corresponding cathode, each of the RF conductors having a plurality of prongs spaced in even radial distance so as to couple the RF energy onto a respective cathode in an even manner. Each of the RF match circuits may comprise a high frequency input, a low frequency input, a combined output, a high frequency matching circuit coupled between the high frequency input and combined output, a low frequency matching circuit coupled between the low frequency input and the combined output, and wherein the high frequency matching circuit presents high impedance to the second and fourth frequencies, and said low frequency matching circuit presents high impedance to the first and third frequencies. The first frequency may be selected from about 27 MHz, about 60 MHz, or about 100 MHz. The second frequency may be selected from the range of about 500KHz to 2.2 MHz. Each of the RF match circuits may further couple a third RF frequency to a corresponding cathode. The plasma processing chamber may further comprise a plurality of switches, each operable for selecting one of the first, second and third RF frequencies.

According to another aspect of the invention, a tandem plasma etch chamber is provided, comprising:

a conductive chamber body defining a first process region and a second process region; the chamber body having a partition wall separating the first process region and the second process region; said chamber body further comprising an evacuation chamber in fluid communication with the first process region and the second process region; said evacuation chamber having a single evacuation port; the chamber body coupled to a ground potential;

a vacuum pump coupled to the evacuation port;

a first fixed cathode affixed at bottom part of the first process region and comprising a first chuck for supporting a wafer;

a first showerhead affixed at a ceiling of the first process region; the first showerhead comprising a first electrode;

a second fixed cathode affixed at bottom part of the second process region and comprising a second chuck for supporting a wafer;

a second showerhead affixed at a ceiling of the second process region; the second showerhead comprising a second electrode;

a common gas source providing process gas to the first showerhead and the second showerhead;

a first RF match concurrently coupling at least one low RF frequency and one high RF frequency to the first cathode;

a second RF match concurrently coupling at least one low RF frequency and one high RF frequency to the second cathode;

wherein the high RF frequency is at least two times higher than the low RF frequency. The tandem plasma etch chamber may further comprise a first plasma confinement ring situated about the first cathode and preventing plasma communication from the first processing region to the evacuation chamber; and a second plasma confinement ring situated about the second cathode and preventing plasma communication from the second processing region to the evacuation chamber. Each of the first and second plasma confinement rings may comprise a plasma shield and an RF shield. The plasma shield may comprise a conductive but floating member and the RF shield comprises a grounded conductive member. The tandem plasma etch chamber may further comprising:

a first movable dielectric isolation ring provided at the first processing region;

a second movable dielectric isolation ring provided at the second processing region; and, wherein the first and second isolation rings assume an upper position for wafer loading and assumes a lower position for wafer processing. Each of the first and second isolation rings may have a thickness designed to shield the grounded chamber wall from RF energy. Each of the first and second isolation rings may further comprise at least one pressure equalizing passage. The partition wall may comprise a pressure equalizing channel, the pressuring equalizing channel mating with pressure equalizing passages of the first and second isolation rings, when the first and second isolation rings assume the lower position. The low frequency may be selected from the range of about 500KHz to 2.2 MHz and the high frequency is selected from about 27 MHz, 60 MHz, and 100 MHz. The tandem plasma etch chamber may further comprise a first switch coupled to the first RF match and a second switch coupled to the second RF match, each of the first and second switches operable to select either of:

said low RF frequency from a selection of two low RF frequencies, or said high RF frequency from a selection of two high RF frequencies. Each of the first process region and a second process region may be operated independently of the other.

According to a further aspect of the invention, a decoupled reactive ion etch chamber is provided, comprising:

a conductive chamber body defining a plurality of process regions; the chamber body having partition walls separating the plurality of process regions from each other; said partition walls comprising a fluid conductance channel to equate pressure among the process regions; said chamber body further comprising an evacuation chamber in fluid communication with the process regions; the chamber body coupled to a ground potential;

at least one vacuum pump coupled to the evacuation chamber;

a plurality of cathodes, each cathode affixed at bottom part of a corresponding one of the process regions and comprising a chuck for supporting a wafer;

a plurality of showerheads, each affixed at a ceiling of a corresponding one of the process regions and comprising an electrode;

a common gas source providing process gas to the showerheads;

a plurality of RF matches, each concurrently coupling at least one low RF frequency and one high RF frequency to a corresponding one of the cathodes. The decoupled reactive ion etch chamber may further comprising a plurality of plasma confinement rings, each situated about a corresponding cathode and preventing plasma communication from a processing region to the evacuation chamber. Each plasma confinement ring may comprise a plasma shield and an RF shield. The plasma shield may comprise a conductive but floating member and the RF shield comprises a grounded conductive member. The decoupled reactive ion etch chamber may further comprise a plurality of movable dielectric isolation rings, each provided at one processing region, each isolation ring defining peripheral boundary of each processing region when the isolation ring assumes its lowered position. Each isolation ring may have a thickness designed to shield the grounded chamber wall from RF energy. Each isolation ring may further comprise at least one pressure equalizing passage, said pressure equalizing passage mating with the fluid conductance channel when the isolation ring assumes its lower position.

BRIEF DESCRIPTION OF THE DRAWINGS

Other aspects and features of the invention would be apparent from the detailed description, which is made with reference to the following drawings. It should be appreciated that the detailed description and the drawings provides various non-limiting examples of various embodiments of the invention, which is defined by the appended claims.

The accompanying drawings, which are incorporated in and constitute a part of this specification, exemplify the embodiments of the present invention and, together with the description, serve to explain and illustrate principles of the invention. The drawings are intended to illustrate major features of the exemplary embodiments in a diagrammatic manner. The drawings are not intended to depict every feature of actual embodiments nor relative dimensions of the depicted elements, and are not drawn to scale.

DETAILED DESCRIPTION

Embodiments of the subject invention provide a versatile plasma chamber enabling precision uniform processing at high throughput. The processing results conform to the high requirements of advanced semiconductor fabrication by combining various features and elements to enable stable and uniform plasma at each processing region. In particular, the combination of features as provided herein enable a multi-station decoupled reactive ion etch with multiple frequency RF power applied at each processing region. Various features and provisions are provided to avoid frequency beating and RF crosstalk between the two tandem processing regions. Notably, heretofore no tandem chamber has been proposed wherein decoupled RIE is enabled by the use of two RF frequencies fed from the cathode for each processing region.

Figure 1:
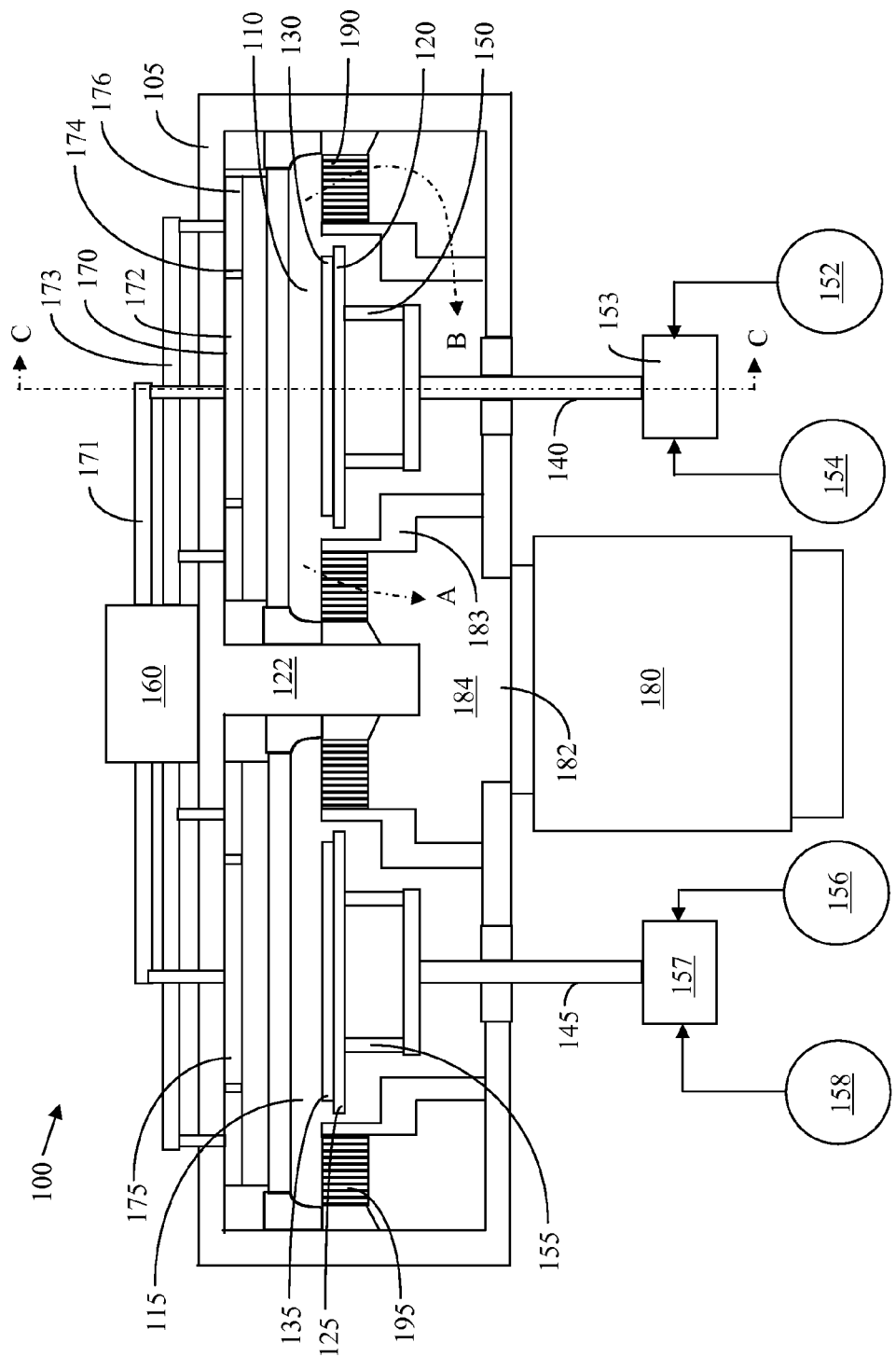
FIG. 1 is a schematic cross section of a tandem plasma chamber according to an embodiment the invention.
Figure 2:
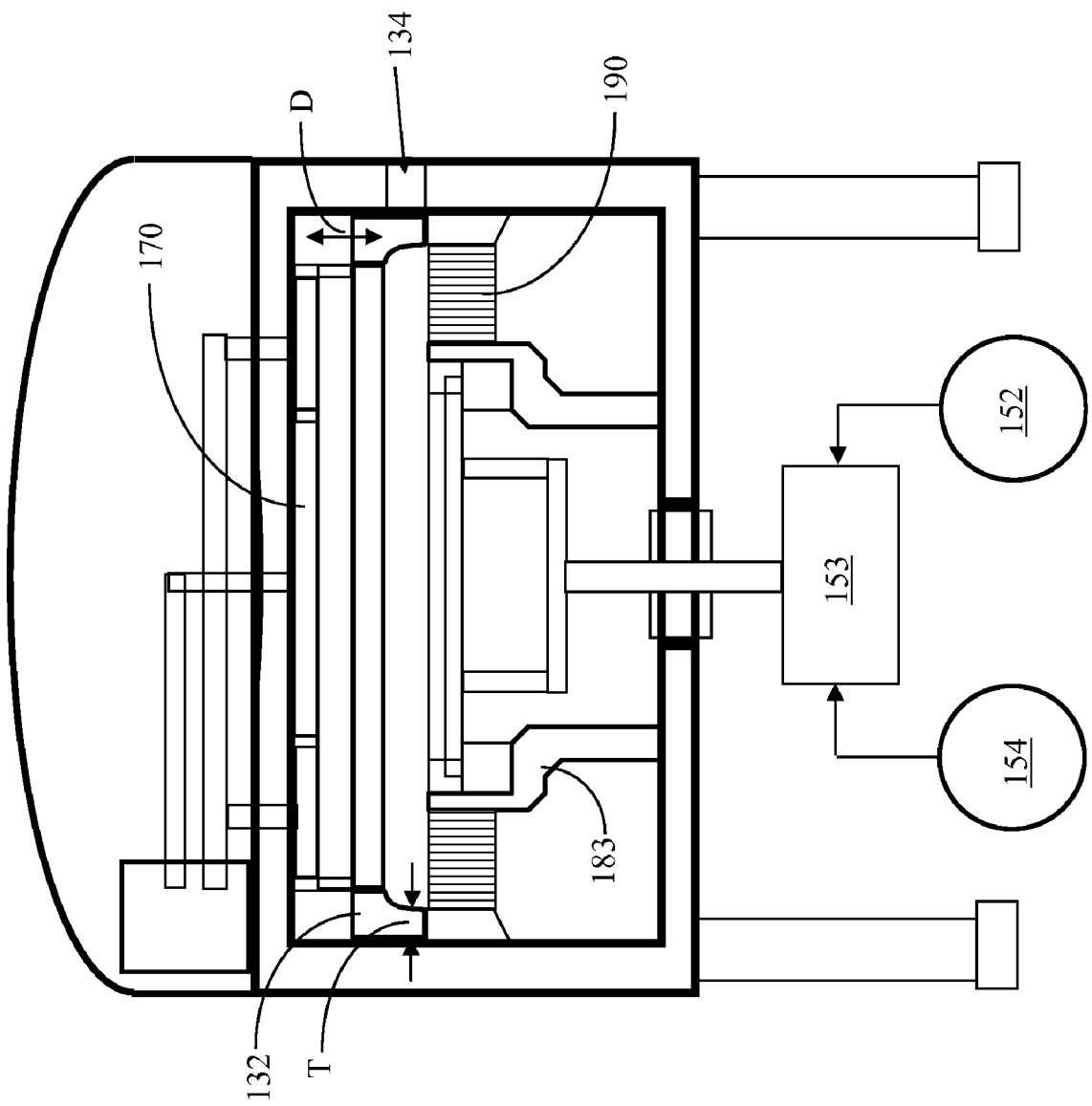
FIG. 2 is a schematic cross section along line C-C of FIG. 1.

FIG. 1 is a schematic cross section of a tandem plasma chamber 100 according to an embodiment the invention, while FIG. 2 is a cross section along lines C-C of FIG. 1. The description proceeds herein with reference to these two Figures. The chamber body 105 is generally made of metallic material, such as aluminum, and defines two tandem processing regions 110 and 115. The processing regions 110 and 115 are physically separated by partition 122; however, as will be described below, pressure equalization mechanism is provided to equalize the pressure between the two processing regions 110 and 115. The chamber body, including partition wall 122, are grounded, so as to provide electrical field isolation between the two processing regions 110 and 115, thereby helping in avoiding RF crosstalk.

A fixed cathode 120 and 125 is provided in each of processing regions 110 and 115, so as to hold wafers 130, 135, for processing. In this embodiment a fixed cathode is used, as it enables better grounding than a movable cathode. Since in this embodiment two frequencies are fed from the cathode, efficient grounding is critical. Therefore, the use of fixed cathode is advantageous for this embodiment.

The cathodes 120 and 125 include a chucking mechanism, so as to hold the wafers in place. The chucking mechanism may be any conventional chuck, such as conventional electrostatic chuck. Additionally, the cathodes 120 and 125 include an embedded electrode, for radiating RF energy into the processing region. The RF energy is supplied to the cathodes by RF conductors 140 and 145. Each RF conductor is coupled to two RF power supplies, 152 and 154 for RF conductor 140, and 156 and 168 for RF conductor 145, via match circuits 153 and 157. In this embodiment, distribution of the RF power over the cathode is done evenly, which, in this embodiment, is accomplished by 3-pronged coupler, 150 and 155, each having three connectors (only two shown in the cross-section) that are separated from each other by 120°.

In this embodiment decoupled RIE is enabled by the use of two RF frequencies applied to each cathode, wherein the two frequencies are sufficiently apart so that the RF power from the two power suppliers is decoupled. For example, the ratio of the high frequency to the low frequency is set to be above about 10. This ensures isolation between the two frequencies. In one example the lower frequency is selected from the range of about 500 KHz to 2.2 MHz. In one specific example the low frequency is set to about 2 MHz, while the second frequency is set at about 27 MHz. In another example the low frequency is set at about 2 MHz, while the second frequency is set at about 60 MHz or 100 MHz.

In this embodiment, interference between processing regions 110 and 115 is avoided in part by the use of frequency tuning for the RF power sources. This enables fast tuning (e.g., less than 1 second response) so that any disturbance in one processing region would not adversely effect the processing in the adjacent tandem region. According to one embodiment, high efficiency, self isolation RF match 153 and 157 are provided, each coupling two RF signals into the cathode of one processing region. For this purpose, one may use the RF match disclosed in US Published Application 2005/0133163. However, the RF match disclosed in the '163 Application requires the use of a filter, which further complicates the construction of the RF match. Therefore, it is more advantageous to utilize an RF match such as that described in US Published Application 2007/0030091, the entire disclosure of which is incorporated herein by reference. The novel design on the RF match of the '091 Application avoids the need for a filter.

Figure 5:
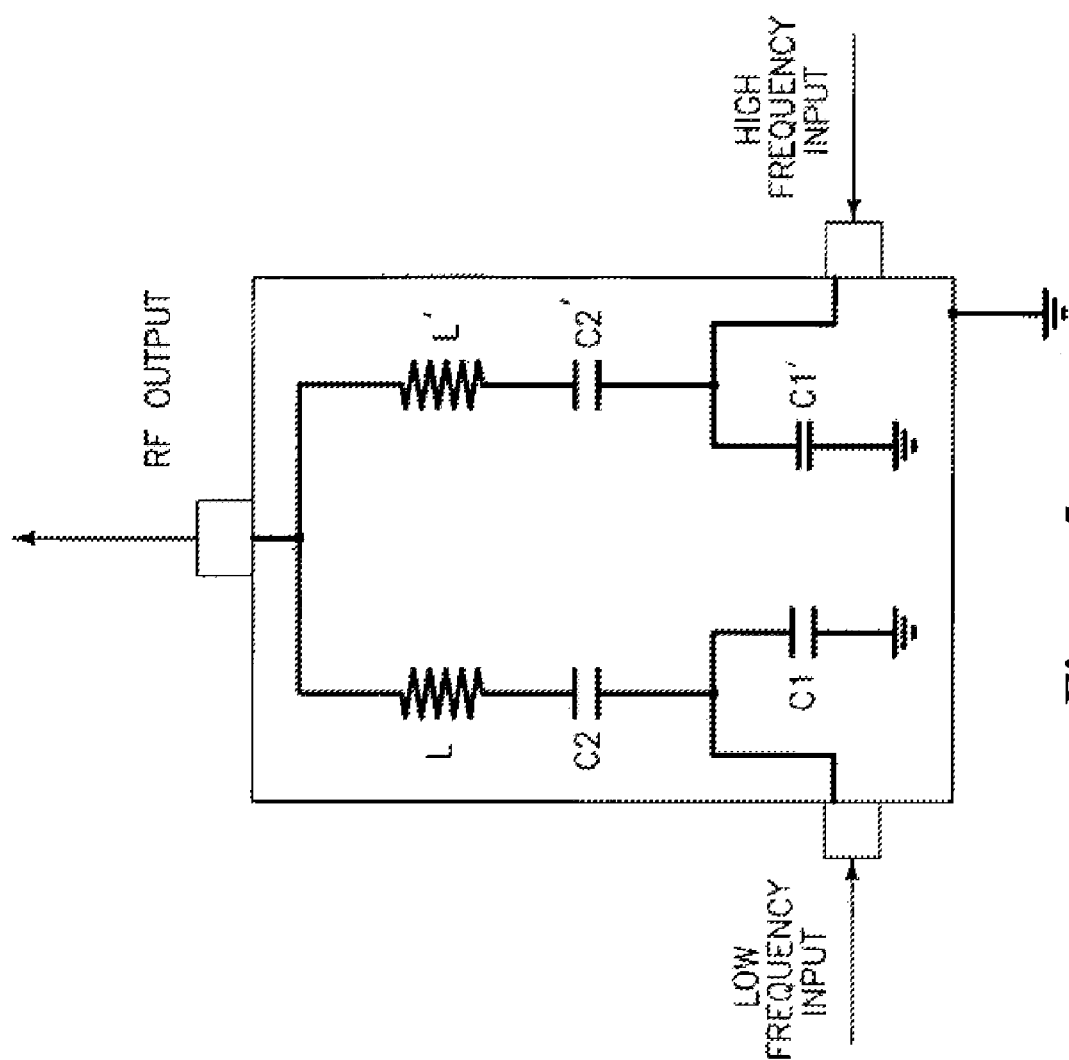
FIG. 5 is a schematic diagram of the structure of an RF matching network of the present invention.

FIG. 5 is a schematic diagram of the structure of an RF matching network which may be employed in the chamber of the present invention and which does not require the use of a filter. As shown, this embodiment has two RF inputs, one being the high frequency input part, the other being a low frequency input part. There are overall three ports in the RF matching network, and wherein two are input ports, namely the high frequency input port connected to the high frequency RF generator, e.g., 158, and the low frequency input port connected to the low frequency RF generator, e.g., 156, and an RF output port outputting the energy of multiple RF generators to the vacuum processing chamber via conductors, e.g., 145. The RF matching network of the vacuum processing chamber can be divided into a low frequency part and a high frequency part, and wherein these two parts are joined at the output port with a single connection point. The high frequency part comprises a grounded capacitor C1', a capacitor C2', and an inductor L'. Further, the low frequency part comprises one end which is grounded through a capacitor C1, and the other end connected to a capacitor C2, which is connected in series to an inductor L, and to the output port through the inductor L.

In the low frequency part, inductor L, capacitor C1 and capacitor C2 form a low pass filter, while in the high frequency part, inductor L', the grounding capacitor C1' and capacitor C2' form a high pass filter. In the case that the frequency of the high frequency input is far higher than the frequency of the low frequency input, namely the frequency of the high frequency input is about 10 times higher than the low frequency input, then, under those circumstances, and due to the characteristics of the high pass filter, and the impedance characteristics of the vacuum processing chamber under high frequency input, a minor inductance is needed by the high frequency part to realize the conjugate match between the overall matching network and the vacuum processing chamber. It is also feasible, under some circumstances, to provide no physical inductor in the high frequency part, but rather use a conducting piece, such as a connection wire, with a conducting connector which extends from the RF output port, to the lower electrode of the vacuum processing chamber. This takes the place of the inductor. In this arrangement, the self-inductance of the conducting piece and conducting connector are substantially equivalent to an inductor. In this case, the grounding capacitor C1' can be replaced by the parasitic capacitor between the conducting piece, the conducting connector and ground. Because the parasitic capacitor C1' and L' are minor in value, and not easily tuned, capacitor C2' in the high frequency part can be provided as a variable capacitor in order to adjust the impedance of the circuit.

The value of the capacitors and the inductors can be estimated from the frequencies of the high frequency and low frequency part. Also, the ideal impedance can be obtained by selecting the value of capacitor C1. It will be recognized that these networks, consisting of capacitors and inductors, have a complex impedance themselves. Therefore, with the self-resistance of circuit components and wires, it is possible, by selecting and adjusting the values of the components of the matching networks, and when the low frequency part is connected to the low frequency RF generator, that the resulting impedance under low frequency and when measured from the output port to the low frequency part, is a substantial conjugate match to the impedance under low frequency when measured from the output port via the return path. When the high frequency part is connected to the high frequency RF generator, the impedance under high frequency measured from the output port to the high frequency part, is a substantial conjugate match to the other impedance under high frequency measured from the output port via the return path to the high frequency part.

In the RF matching network as seen in FIG. 5, low frequency RF energy is output at the output port through the circuit which consists of capacitor C2, and inductor L. Then the low frequency RF output may have two branches or ways to go, namely inputting into the vacuum processing chamber or inputting into the high frequency part. The high frequency part comprises (in addition to parasitic capacitance) capacitor C2' and inductor L'. In this embodiment, the capacitor C2' and inductor L' in the high frequency part have been configured such that for the low frequency RF input the impedance of the high frequency part is much greater than that of the vacuum processing chamber. Therefore, most of the energy of the low frequency RF generator is inputted into the vacuum processing chamber. Furthermore, by selecting proper values for the capacitor C2', the energy inputted into the high frequency part can be reduced to below 2%.

In a similar manner, the high frequency RF energy arrives at the output port through the circuit consisting of capacitor C2' and inductor L'. Then the high frequency RF output may have two branches or ways to go, namely inputting into the vacuum processing chamber or inputting into the low frequency part. The low frequency part comprises parasitic capacitance, capacitor C2, and inductor L, wherein inductor L, and capacitor C2 are connected in series. One end of capacitor C1 connected to capacitor C2, and the other end being grounded. With this circuit configuration, and adding the estimated values of the capacitors and the inductor, and by further adjusting the value of capacitors, it can be realized that for the high frequency RF input, the impedance of the low frequency part is much greater than that of the vacuum processing chamber. Therefore, most of the energy of the high frequency RF generator is inputted into the vacuum processing chamber. Furthermore, by selecting a proper value for capacitor C1, the energy inputted into the low frequency part can be reduced below 2%.

Returning to FIGS. 1 and 2, processing gas is provided from a common source 160. The gas from the common source 160 is distributed into each processing region from the showerheads 170, 175 which, in this embodiment, are dual-zone showerheads. That is, as shown in FIG. 1, showerhead 170 comprise central region 172 and peripheral region 176, separated by seal 174. Gas delivery pipe 171 delivers gas to the central region 172, while gas delivery pipe 173 delivers gas to the peripheral region 176. The ratio of gas delivery of the central region to the peripheral region can be controlled by common source 160. Additionally, the constituents of the gas delivered by pipes 171 and 173 can be controlled by common source 160. That is, pipes 171 and 173 may deliver different or the same gas or composition of gases. A complementary arrangement is made for processing region 115.

The showerheads 170 and 175 also include an embedded conductive electrode so as to form the ground path for the RF power coupled to the respective cathode 120 and 125.

FIG. 1 also depicts a central vacuum pump 180. Vacuum pump 180 evacuates both processing regions 110 and 115 via pumping port 182 of evacuation chamber 184. The use of a single pump 180 simplifies the overall chamber construction and allows the chamber to be compact. Additionally, the common pumping port assist in equalizing the pressure between the two processing regions 110 and 115. However, such an arrangement also introduces some issues that are addressed in this embodiment as follows.

The following explanation is provided with respect to processing region 110, however, it should be understood that the same is equally applicable to processing region 115. As shown in FIG. 1, since the pumping port 182 is provided between the two processing regions 110 and 115, it creates a skewed pumping path for each processing region. For example, arrow A illustrates the path species follow from the part of the region that is close to the pumping port 182, while arrow B illustrate the path species would follow from the part of the processing region that is remote from the pumping port 182. As can be understood, path B is longer than path A, which leads to pressure differential across the processing region 110. To overcome this problem, in this embodiment a micro-channel plasma confinement ring 190, 195, is provided in each processing region. The confinement ring 190 provides isolation between the processing region 110 and pumping port 182, while allowing vacuum pumping from the processing region 110 in a manner equalizing the pressure across processing region 110. The ring 190 may be implemented as any of the rings disclosed in U.S. Published Application 2007/0085483, the entire disclosure of which is incorporated herein by reference.

Figure 3:
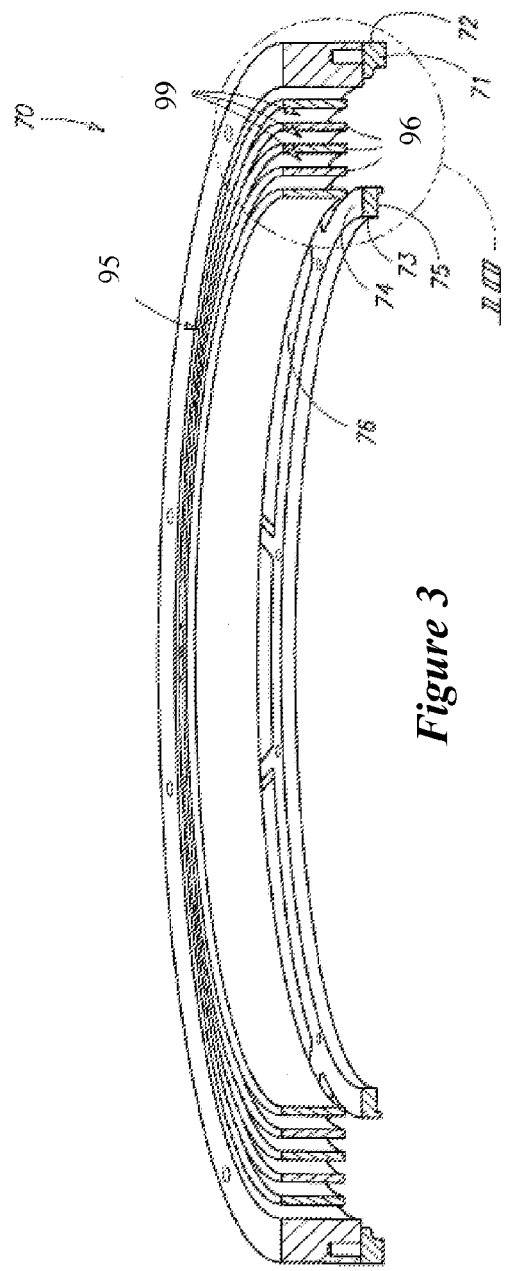
FIG. 3 is a transverse, vertical, sectional view of embodiment of the plasma confinement apparatus of the present invention.
Figure 4:
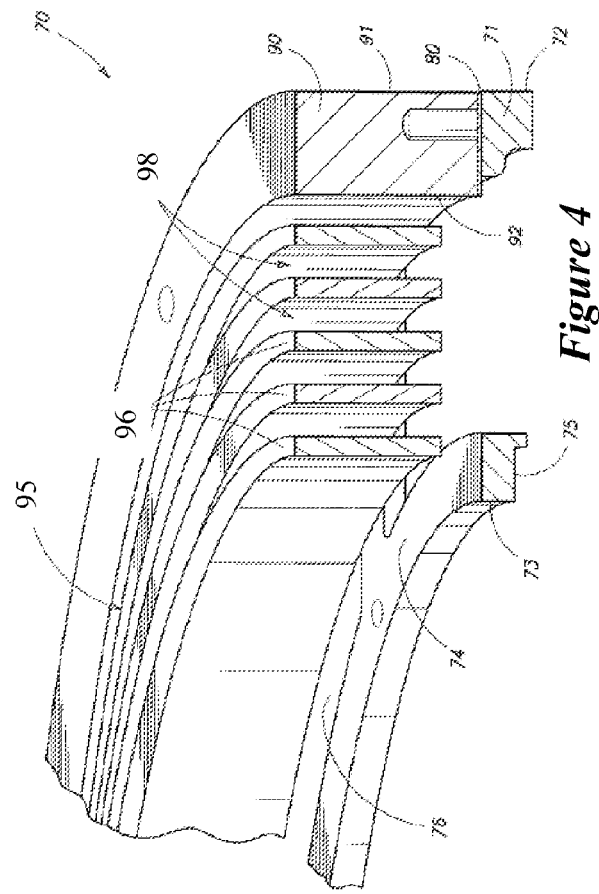
FIG. 4 is a fragmentary, enlarged vertical, sectional view of the embodiment of the plasma confinement apparatus as seen in FIG. 3.

An embodiment of the plasma confinement ring which may be used with the chamber of FIG. 1 is generally indicated by the numeral 70 in FIGS. 3 and 4. While other plasma confinement rings may be used, the embodiment of FIGS. 3 and 4 will now be described with some specificity to provide a more complete explanation to the reader. The plasma confinement apparatus as seen in FIGS. 3 and 4 is positioned between a processing region 110 and evacuation chamber 184. In the embodiment of FIG. 1, the ring 70 is provided so its top portion is at about the same level as the wafer 130. The plasma confinement ring 70 includes, in part, a conductive electrically-grounded member, which is generally indicated by the numeral 71. The electrically grounded member is defined by an outside peripheral edge 72, and an opposite inside peripheral edge 73, which typically surrounds the interior wall 183 of the evacuation chamber 184. Still further, the electrically grounded member 71 has a top surface 74, and an opposite bottom surface 75. As illustrated, a plurality of passageways 76 are formed in a predetermined pattern in the electrically grounded member 71, and extend between the top and bottom surfaces 74 and 75, thereof. The electrically grounded member 71, forms an electric field shield, substantially inhibiting RF emissions from reaching the pumping port 182. In this manner, plasma cannot be ignited in the pumping port 182. Additionally, RF crosstalk between the two processing regions 110 and 155 is prevented.

The plasma confinement ring 70 further includes an electrically insulative layer 80 which is positioned on, or in partial covering relation relative to, the top surface 74 of the electrically grounded member 71. As seen in FIG. 4, the electrically insulative layer extends substantially radially, inwardly relative to the outside peripheral edge 72. The electrically insulative layer may comprise a single layer as illustrated, or multiple layers. Positioned or otherwise resting on the electrically insulative layer 80 is an electrically conductive support ring which is generally indicated by the numeral 90. The support ring has an outside peripheral edge 91 which is substantially co-planar relative to the outside peripheral edge 72 of the electrically grounded member, and further has an inside peripheral edge 92 which is spaced therefrom. The support ring 90 which is made integral with a plurality of electrically conductive members 95 orients the respective electrically conductive members 95 in predetermined spaced relation relative to, and electrically insulated from the electrically grounded member 71, so that the plurality of electrically conductive members 95 are electrically floating from ground during processing. The plurality of electrically conductive members 95 are here illustrated as a plurality of spaced substantially concentric rings 96 which define a plurality of passageways 99 therebetween, and which are coupled in fluid flowing relation relative to the plurality of passageways 76 which are defined by the electrically grounded member 71. Therefore, the passageway 76 and 99, respectively form a fluid pathway which allows the processing gasses employed to form the plasma used in the processing region 110 to depart from the processing region, and travel to the exhaust port 182. The electrically conductive components or members 95 may, in one form of the invention, be fabricated from a doped semiconductive material. In this arrangement, the doping of the semiconductive material increases the electrical conductivity of the semiconductive material.

As should be understood from a study of FIG. 4, each of the passageways 99 have a length dimension which is larger than a mean free path length of any charged species which may exist within the plasma which is formed in the processing region 110. Therefore, as the plasma passes from the processing region to the exhaust region, any charged species passing through the passageways 99 have a tendency to strike the plurality of electrically conductive concentric rings 96, thereby quenching the charged species before the charged species reaches the exhaust region of the plasma processing apparatus. In the present invention as seen at FIGS. 3 and 4, it should be understood that the surfaces of the electrically conductive member 95, here shown as a plurality of electrically conductive and concentric rings 96 may be coated with, or enclosed within, a material which is substantially resistant to etching by the plasma which is produced in the processing region 110. In one embodiment of the invention, the material which is coated onto the surfaces of the plurality of electrically conductive members 96 may comprise $Y_2O_3$. This surface coating ensures that the electrically conductive member 95 does not become etched by a plasma and thereby create particles. In still another embodiment the electrically conductive member 96 may comprise a plate which has slotted perforations or holes formed therein, rather than utilizing the arrangement of conductive members 96.

Several alternative embodiments of the confinement ring are possible. For example, it should be understood that the surfaces of the electrically grounded member 71 and plurality of electrically conductive rings 96 which contact any plasma may be anodized in order to resist etching, and form electrically insulative layers thereon. It will be recognized that anodizing is a type of electrolysis which causes a protective oxide coating to be formed on a metal. Anodizing may serve several purposes including providing a tough coating on the surface of a metal, as well as imparting electrical insulation and corrosion resistance to the metal. In one form of the invention, the plurality of electrically conductive members 96, electrically conductive support ring 90, and the electrically grounded member 71 are formed of aluminum, and the electrically insulative layer 80 is an aluminum anodized layer which is formed by either anodizing the surface of the electrically conductive support ring 90 which faces toward the electrically grounded member 71, or anodizing the surface of the electrically grounded member 71 which faces toward the electrically conductive support ring 90. In another form of the invention, all surface areas of these same structures may be anodized. This ensures that the electrically conductive member 95 is electrically floating relative to the ground during processing. Still further, in yet another form of the invention, the surface areas of the plurality of electrically conductive rings which face in the direction of, or contact any plasma may first be anodized, and then later coated with $Y_2O_3$ which further resists etching. In addition to the foregoing, an electrically insulative spacer ring (not shown) may be oriented between the electrically conductive support ring 90, and the underlying electrically grounded member 71, and which ensures that the electrically conductive member 95 is electrically floating relative to ground. In this form of the invention, the electrically insulative layer 80, can be replaced by the electrically insulative spacer. This electrically insulative spacer, similarly causes the electrically conductive member 95 to become electrically floating from ground.

As can be understood, the plasma confinement ring 70 for use in the plasma processing region 110 comprises a stack of an electrically grounded member 71, and an electrically conductive, but floating member 95 positioned over the electrically grounded member 71. In this manner, the plasma confinement ring of this embodiment forms a plasma shield and an RF shield. That is, the floating member comprises a plasma shield, preventing active species from passing therethrough, while the grounded member comprises an RF shield, preventing RF energy from passing therethrough. The floating member 95 defines a plurality of passageways 99 through which pumping of the processing region 110 is enabled in a controlled manner. The plurality of passageways 99 are sized so as to quench the charged species and allow the neutral species to pass therethrough. In this manner, the confinement ring 70 enables control of pumping of processing region 110 so as to provide uniform pressure across the processing region, prevents charged species from reaching the pumping port 182, prevents RF coupling into the pumping port 182 so as to prevent plasma ignition in pumping port 182, and prevents RF crosstalk between the processing regions 110 and 115.

Another feature of this embodiment is indicated in FIG. 2 as isolation ring 132. Isolation ring 132 is movable in the vertical direction, as shown by arrow D. For transferring wafers into and out of the processing region 110, the ring is moved to the upper position, so as to expose wafer-loading slit 134. Once a wafer is situated on the cathode, the isolation ring is lowered to the position shown in FIG. 2. In this position, the processing region 110 defined by the isolation ring is symmetrically circular, and the loading slit 134 is "hidden" from the plasma, so that the plasma "sees" only a circular boundary. That is, in its lowered position, each isolation ring defines the peripheral boundary of each processing region. Additionally, in this embodiment the isolation ring is made of dielectric material and has a thickness, T, so as to isolate the grounded chamber wall from the plasma. That is, thickness T is calculated so that it prevents return path from the plasma via the grounded wall 105. In this manner, the RF return path is controlled to flow via the showerhead 170, which serves as a top electrode to RF path return.

Figure 6:
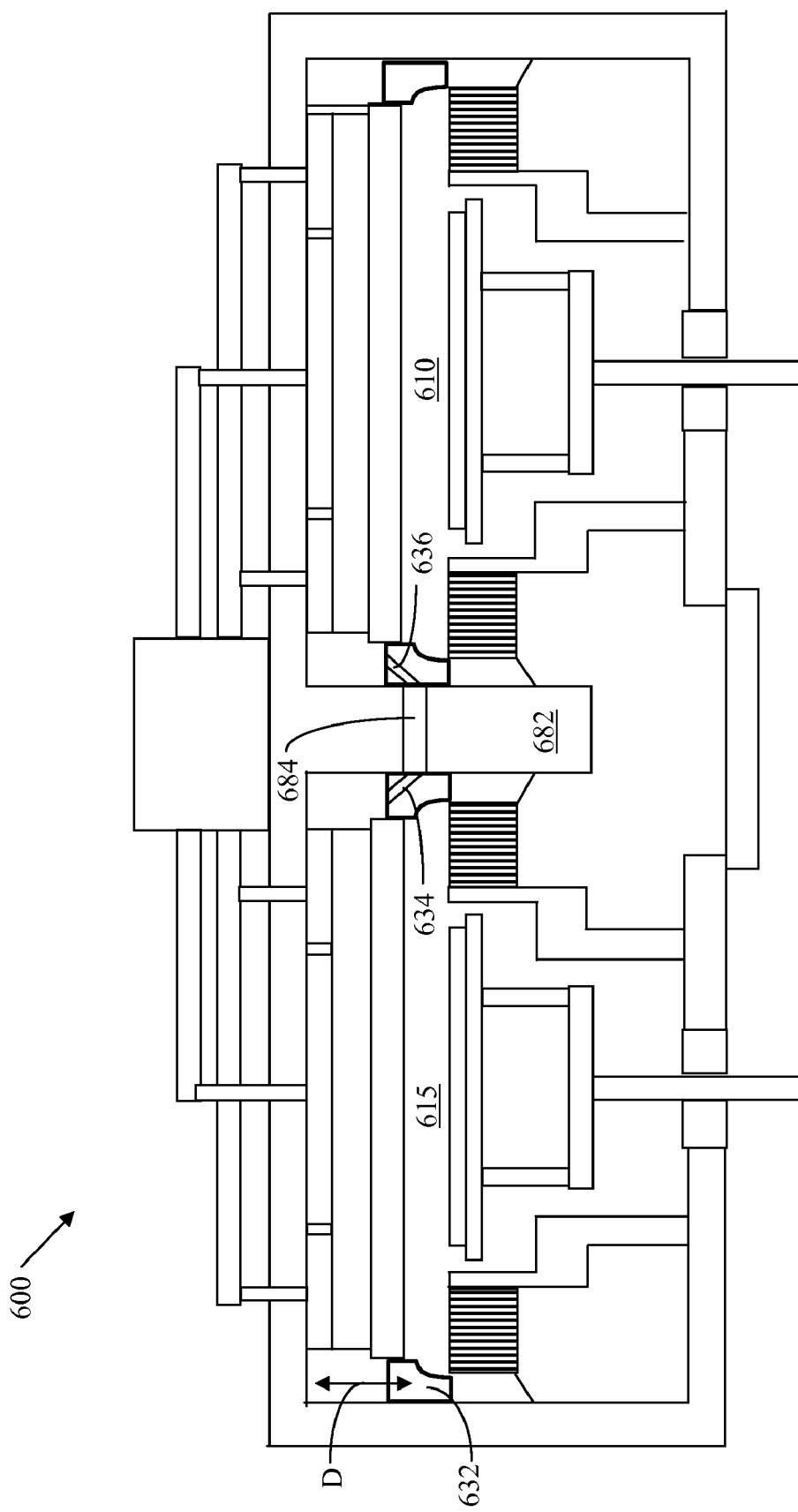
FIG. 6 illustrate an embodiment wherein pressure equalizing mechanism is provided between the two processing regions.

The isolation ring 132 may also be used for pressure equalizing. An example of such an arrangement is shown in FIG. 6. The chamber 600 of FIG. 6 is similar to that of FIGS. 1 and 2, so that it will not be described in details, other than highlighting specific features illustrated in FIG. 6. Notably, FIG. 6 illustrates an embodiment wherein pressure equalizing mechanism is provided between the two processing regions. In this example, the pressure equalizing mechanism is implemented using the isolation ring 632. As illustrated, a channel 684 is provided in partition 682. When the isolation ring 632 is moved to its upper position, as shown by arrow D, the channel 684 enables free gas passage between the two processing regions 610 and 615. Additionally, channels 634 and 636 are provided in isolation ring 632. When the isolation ring is placed at its lower position, as shown in FIG. 6, the channels 634 and 636 form a passage with channel 684. In this manner, pressure between processing regions 610 and 615 can be equalized by fluid communication via channels 634, 684, and 636.

Figure 7:
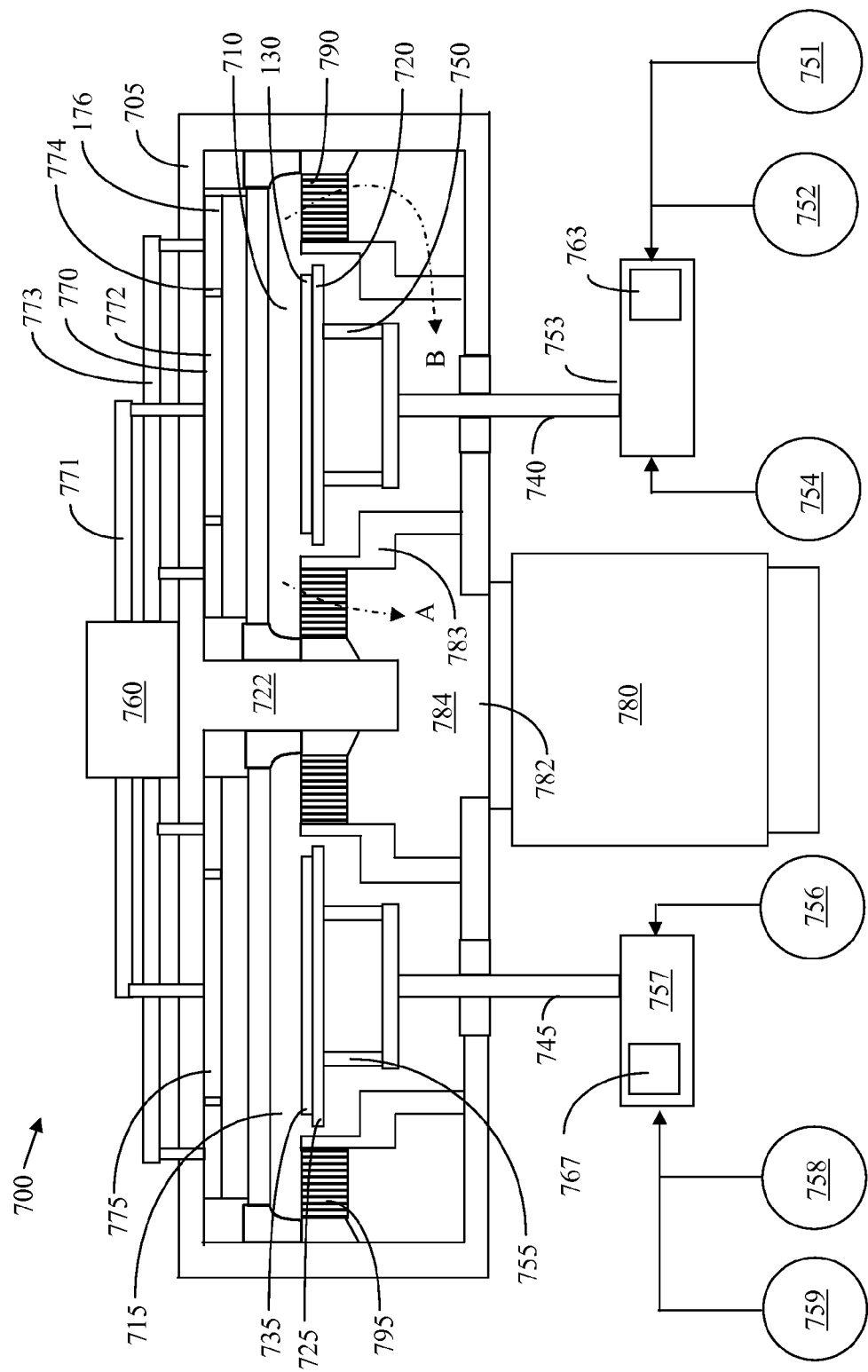
FIG. 7 illustrates another embodiment of the invention wherein multiple frequencies are applied to each of the two cathodes.

FIG. 7 illustrates another embodiment of the invention wherein multiple frequencies are applied to each of the two cathodes. The embodiment of FIG. 7 may be implemented by modifying any of the other embodiments described herein, on in conjunctions with other embodiments not specifically described herein, but which can be construed from the disclosure provided herein. The specific embodiment illustrated in FIG. 7 utilizes the basic embodiment shown in FIG. 1 and, therefore, similar elements are indicated with similar numerical references, except that they are in the 700-series rather than 100 series.

As shown in FIG. 7, each of the cathodes, 720, 725, received three RF frequencies. This is done to improve control of the etch process, by separately controlling plasma density and ion energy. That is, one or two frequencies may be used to control plasma ion energy. The plasma ion energy frequency should be selected on the lower range, for example, one frequency selected from the range 500 KHz-2 MHz while the other set to 13 MHz (more precisely, 13.56 MHz). These are generally referred to as the bias frequencies. The plasma density can be controlled by a higher RF frequency, e.g., 27 MHz, 60 MHz, 100 MHz, or 160 MHz, which is referred to as the source frequency. On the other hand, an arrangement of a single bias frequency and dual source frequencies may be employed. For example, the single bias frequency may be selected from the values 500 KHz-2 MHz and 13 MHz. Then, the dual source frequencies may be selected from, e.g., 27 MHz, 60 MHz, 100 MHz, or 160 MHz.

In one specific example, one bias frequency, 754, 757, is used and is set to 2 MHz or 13MHz. Two source frequencies are used, 752 and 754 for cathode 720 and 758 and 759 for cathode 725. One of each source RF frequency is set to 27 MHz and the other to 60 MHz. Such an arrangement provides improved control of the plasma species dissociation.

Another feature illustrated in the embodiment of FIG. 7 is the switches 763 and 767. Switches 763 and 767 enable switching among the various supplied frequencies for further improved control of plasma dissociation. By using the switches 767 and 767, any of the above embodiments can be used to operate a plasma chamber to provide a processing having a first period operating at a first combination of bias and source frequencies, and a second period operating at a second combination of bias and source frequencies. For example, the chamber may be operated using a low bias frequency, e.g., about 2 MHz for the main etch step; however, in order to create a "soft landing" during the over etch the system may be switched to operate using a higher frequency bias, such as, e.g., about 13 MHz. On the other hand, the chamber may be operated using a low source frequency, e.g., about 27 MHz for the etch step; however, after completion of the etch, the wafer may be removed and the chamber cleaned using higher density plasma. The higer density plasma may be created using a higher source frequency, e.g., 60 MHz, 100 MHz, or 160 MHz.

Figure 8:
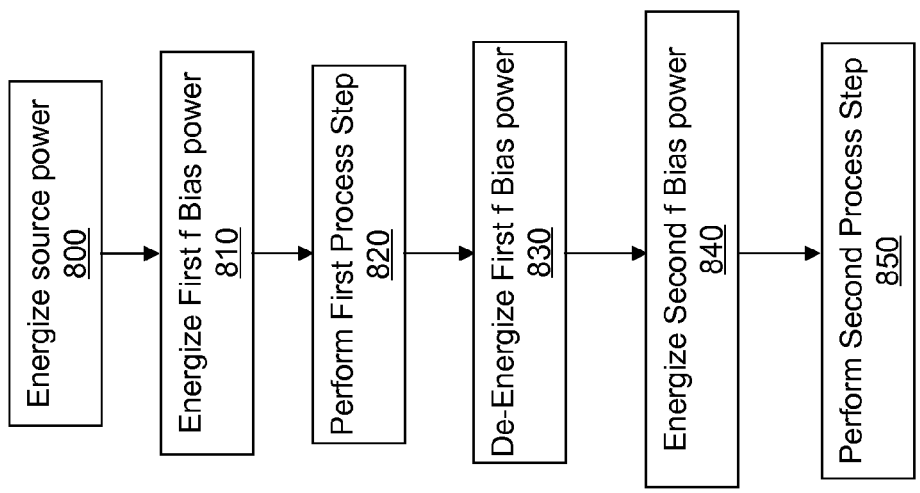
FIG. 8 provides an example for processing using two bias frequencies, according to an embodiment of the invention.

FIG. 8 provides an example for processing using two bias frequencies, according to an embodiment of the invention. This process may be, for example, etching of a semiconductor wafer. In step 800 the source RF power supply is energized to strike the plasma. The source RF power may be at frequencies, e.g., 27 MHz, 60 MHz, 100 MHz, 160 MHz, etc. At step 810 the first bias frequency is energized and applied to the chamber to cause the dissociated ions to bombard the wafer during a first processing step (Step 820). When the first processing step is completed, at step 830 the first bias power is de-energized and at step 840 the second bias power is energized so as to proceed with the second processing at step 850. In this case, the first bias frequency may be, e.g., about 2 MHZ and the second bias frequency about 13 MHz. In this case, when the bias frequency is 2 MHz, the source frequency is at least ten times higher. On the other hand, when the bias frequency is 13 MHz, the source frequency may be twice or higher frequency. E.g., when the bias is 13 MHz, the source may be twice, i.e., 27 MHz, about five times higher, i.e., 60 MHz, or even higher at 100 MHz or 160 MHz.

Figure 9:
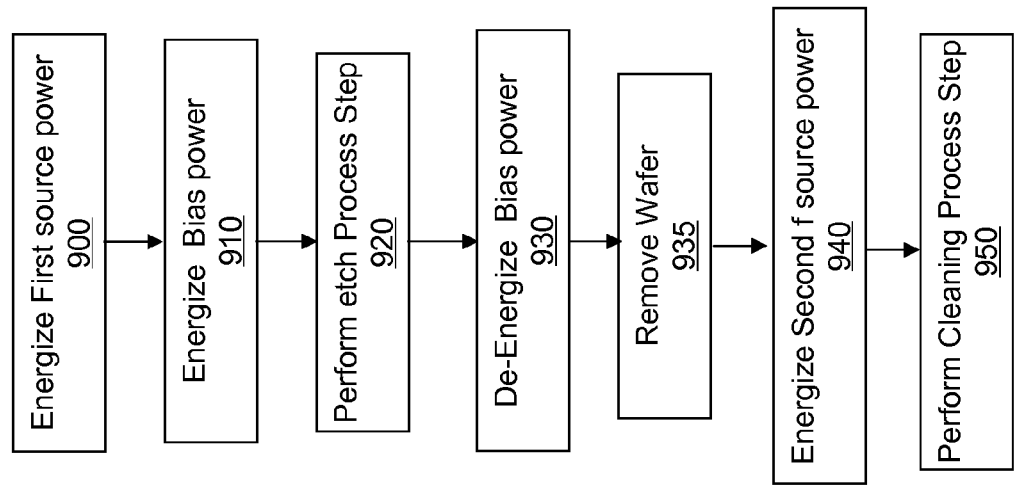
FIG. 9 provides an example for processing using two source frequencies, according to an embodiment of the invention.

FIG. 9 provides an example for processing using two source frequencies, according to an embodiment of the invention. This process may be, for example, etching of a semiconductor wafer and then performing "in-situ" clean process. In step 900 the first source RF power supply is energized to strike the plasma. The source RF power may be at frequencies, e.g., 27 MHz. At step 810 the bias frequency is energized and applied to the chamber to cause the dissociated ions to bombard the wafer during an etch processing step (Step 920). When the etch processing step is completed, at step 930 the bias power is de-energized and at step 935 the wafer is removed from the chamber. Then at step 940 the second source power is energized so as to proceed with the cleaning step 950. In this case, the second source frequency may be, e.g., 60 MHZ, 100 MHz, or 160 MHz.

It should be understood that processes and techniques described herein are not inherently related to any particular apparatus and may be implemented by any suitable combination of components. Further, various types of general purpose devices may be used in accordance with the teachings described herein. It may also prove advantageous to construct specialized apparatus to perform the method steps described herein. The present invention has been described in relation to particular examples, which are intended in all respects to be illustrative rather than restrictive. Those skilled in the art will appreciate that many different combinations of hardware, software, and firmware will be suitable for practicing the present invention. For example, the described methods and systems may be implemented in a wide variety of programming or scripting languages, such as Assembler, C/C++, perl, shell, PHP, Java, etc.

The present invention has been described in relation to particular examples, which are intended in all respects to be illustrative rather than restrictive. Those skilled in the art will appreciate that many different combinations of hardware, software, and firmware will be suitable for practicing the present invention. Moreover, other implementations of the invention will be apparent to those skilled in the art from consideration of the specification and practice of the invention disclosed herein. Various aspects and/or components of the described embodiments may be used singly or in any combination in the plasma chamber arts. It is intended that the specification and examples be considered as exemplary only, with a true scope and spirit of the invention being indicated by the following claims.

The invention claimed is:

1. A plasma processing chamber having at least two processing regions to enable individual or simultaneous processing of at least two wafers, comprising:

a chamber body having a grounded wall defining at least two plasma processing regions, each processing region having a cathode situated at a lower part thereof and an anode situated in a ceiling thereof, said chamber body defining an evacuation path;

at least one vacuum pump coupled to the evacuation path;

at least two RF match circuits, each RF match circuit simultaneously coupling at least a first RF frequency and a second RF frequency to a corresponding one of the cathodes, wherein the first frequency is higher than the second frequency; and, two movable dielectric isolation rings, each provided at one processing region and each being vertically movable between loading/unloading position and processing position, each isolation ring defining peripheral boundary of each processing region when the isolation ring assumes its processing position, wherein each isolation ring has a thickness, T, such that it prevents return path from the plasma via the grounded wall, whereby the RF return path is controlled to flow via the anode.

2. The plasma processing chamber of claim 1, further comprising at least two plasma confinement rings, each situated about a corresponding cathode and preventing plasma communication from a processing region to the evacuation path.

3. The plasma processing chamber of claim 2, wherein each plasma confinement ring comprises a plasma shield and an RF shield.

4. The plasma processing chamber of claim 3, wherein the plasma shield comprises a conductive but floating member and the RF shield comprises a grounded conductive member.

5. The plasma processing chamber of claim 1, further comprising a plurality of RF conductors, each coupling energy from one RF match circuit to a corresponding cathode, each of the RF conductors having a plurality of prongs spaced in even radial distance so as to couple the RF energy onto a respective cathode in an even manner.

6. The plasma processing chamber of claim 5, wherein each of the RF match circuits comprises a high frequency input, a low frequency input, a combined output, a high frequency matching circuit coupled between the high frequency input and combined output, a low frequency matching circuit coupled between the low frequency input and the combined output, and wherein the high frequency matching circuit presents high impedance to the second frequency, and said low frequency matching circuit presents high impedance to the first frequency.

7. The plasma processing chamber of claim 6, wherein the first frequency is selected from about 27 MHz, about 60 MHz, or about 100 MHz.

8. The plasma processing chamber of claim 6, wherein the second frequency is selected from the range of about 500 KHz to 2.2 MHz.

9. The plasma processing chamber of claim 1, wherein each of the RF match circuits further couples a third RF frequency to a corresponding cathode.

10. The plasma processing chamber of claim 9, further comprising a plurality of switches, each operable for selecting one of the first, second and third RF frequencies.

11. A tandem plasma etch chamber, comprising:
a conductive chamber body having a grounded wall defining a first process region and a second process region; the chamber body having a partition wall separating the first process region and the second process region; said chamber body further comprising an evacuation chamber in fluid communication with the first process region and the second process region; said evacuation chamber having a single evacuation port; the chamber body coupled to a ground potential;
a vacuum pump coupled to the evacuation port;
a first fixed cathode affixed at bottom part of the first process region and comprising a first chuck for supporting a wafer;
a first showerhead affixed at a ceiling of the first process region; the first showerhead comprising a first electrode;
a second fixed cathode affixed at bottom part of the second process region and comprising a second chuck for supporting a wafer;
a second showerhead affixed at a ceiling of the second process region; the second showerhead comprising a second electrode;
a common gas source providing process gas to the first showerhead and the second showerhead;
a first RF match concurrently coupling at least one low RF frequency and one high RF frequency to the first cathode;
a second RF match concurrently coupling at least one low RF frequency and one high RF frequency to the second cathode;
wherein the high RF frequency is at least two times higher than the low RF frequency; and,
a first vertically movable dielectric isolation ring provided at the first processing region;
a second vertically movable dielectric isolation ring provided at the second processing region; and,
wherein the first and second isolation rings assume a first position for wafer loading/unloading and assumes a second position for wafer processing, and wherein each of the first and second isolation rings has a thickness, T, such that it prevents return path from the plasma via the grounded wall, whereby the RF return path is controlled to flow via the first and second electrodes.

12. The tandem plasma etch chamber of claim 11, further comprising a first plasma confinement ring situated about the first cathode and preventing plasma communication from the first processing region to the evacuation chamber; and a second plasma confinement ring situated about the second cathode and preventing plasma communication from the second processing region to the evacuation chamber.

13. The tandem plasma etch chamber of claim 12, wherein each of the first and second plasma confinement rings comprises a plasma shield and an RF shield.

14. The tandem plasma etch chamber of claim 12, wherein the plasma shield comprises a conductive but floating member and the RF shield comprises a grounded conductive member.

15. The tandem plasma etch chamber of claim 11, wherein the low frequency is selected from the range of about 500 KHz to 2.2 MHz and the high frequency is selected from about 27 MHz, 60 MHz, and 100 MHz.

16. The tandem plasma etch chamber of claim 11, further comprising a first switch coupled to the first RF match and a second switch coupled to the second RF match, each of the first and second switches operable to select either of:
said low RF frequency from a selection of two low RF frequencies, or
said high RF frequency from a selection of two high RF frequencies.

17. The tandem plasma etch chamber of claim 11, wherein each of the first process region and a second process region can be operated independently of the other.

* * * * *